(12) United States Patent
Kang et al.

(10) Patent No.: US 7,902,022 B2
(45) Date of Patent: Mar. 8, 2011

(54) SELF-ALIGNED IN-LAID SPLIT GATE MEMORY AND METHOD OF MAKING

(75) Inventors: Sung-Taeg Kang, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 381 days.

(21) Appl. No.: 12/181,766

(22) Filed: Jul. 29, 2008

(65) Prior Publication Data
US 2010/0029052 A1    Feb. 4, 2010

(51) Int. Cl.
*H01L 21/336* (2006.01)
(52) U.S. Cl. .............. 438/257; 438/261; 257/E21.409
(58) Field of Classification Search .............. 438/257, 438/261
See application file for complete search history.

(56) References Cited

U.S. PATENT DOCUMENTS

| 5,408,115 | A | 4/1995 | Chang |
| 6,768,681 | B2 | 7/2004 | Kim |
| 6,800,526 | B2 | 10/2004 | Lin et al. |
| 6,960,527 | B2 | 11/2005 | Kang |
| 2003/0223299 | A1 | 12/2003 | Wen et al. |
| 2005/0029574 | A1* | 2/2005 | Jeon et al. ............... 257/314 |
| 2006/0068546 | A1* | 3/2006 | Chang .................. 438/257 |
| 2008/0076243 | A1* | 3/2008 | Chang .................. 438/593 |
| 2009/0004802 | A1* | 1/2009 | Joo et al. ............... 438/287 |
| 2009/0101963 | A1* | 4/2009 | Shen et al. ............. 257/324 |
| 2009/0111265 | A1* | 4/2009 | Min et al. .............. 438/682 |

* cited by examiner

*Primary Examiner* — Alexander G Ghyka
(74) *Attorney, Agent, or Firm* — James L. Clingan, Jr.

(57) ABSTRACT

A method includes forming a silicon nitride layer and patterning it to form a first opening and a second opening separated by a first portion of silicon nitride. Gate material is deposited in the first and second openings to form first and second select gate structures in the first and second openings. Second and third portions of silicon nitride layer are removed adjacent to the first and second gate structures, respectively. A charge storage layer is formed over the semiconductor device after removing the second and third portions. First and second sidewall spacers of gate material are formed on the charge storage layer and adjacent to the first and second gate structures. The charge storage layer is etched using the first and second sidewall spacers as masks. The first portion is removed. A drain region is formed in the semiconductor layer between the first and second gate structures.

10 Claims, 4 Drawing Sheets

SELF-ALIGNED IN-LAID SPLIT GATE MEMORY AND METHOD OF MAKING

BACKGROUND

1. Field

This disclosure relates generally to semiconductor non-volatile memory devices, and more specifically, to a self-aligned in-laid split gate memory and method of making the same.

2. Related Art

In the manufacture of semiconductor non-volatile memory (NVM) devices, various known lithography techniques present serious or difficult gate misalignment control. The techniques also suffer from less scalable integration. In addition, prior manufacturing techniques having included the formation of parasitic control gate (CG) and select gate (SG) structures; however, removal of the parasitic dummy control gate and select gate structures undesirably adds high process complexity and also suffers from scaling limitations. Furthermore, special process steps are required for protecting actual gates and the substrate during removal of the parasitic dummy control and select gate structures. As a result, additional photolithography steps or processes may be required.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

According to one embodiment of the present disclosure, a method of making a self-aligned in-laid split gate memory device includes a combination of spacer and in-laid formation to define the corresponding split gates, as will be discussed further herein. The method can be carried out without the need for tight misalignment requirements. In other words, stringent alignment tolerances can be partially relaxed. Furthermore, a highly controllable split gate formation can be achieved without limitation of lithography, i.e., the SG can be defined with standard lithography. Moreover, the formation, use, and removal of parasitic dummy control and select gate structures is advantageously avoided with the method according to the embodiments of the present disclosure.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
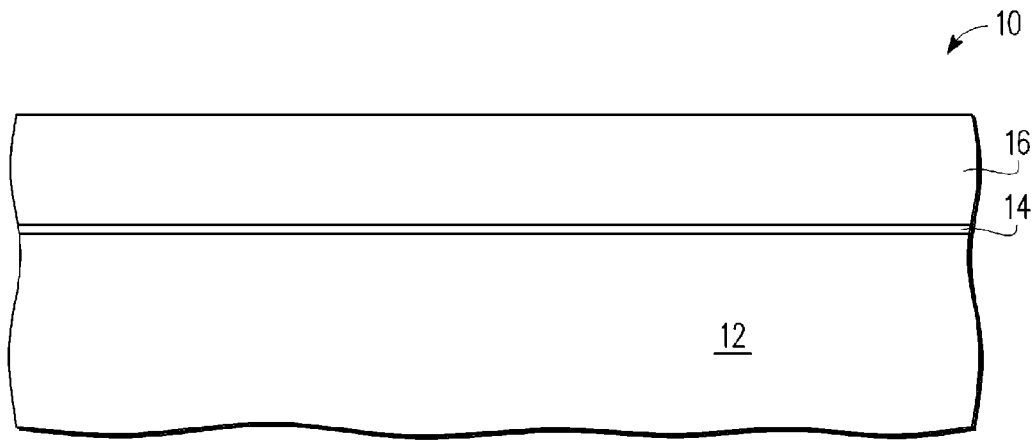
FIGS. 1-10 are cross-sectional views of various steps in the manufacture of a self-aligned in-laid split gate NVM memory according to one embodiment of the present disclosure.

As indicated above, FIGS. 1-10 are cross-sectional views of various steps in the manufacture of a self-aligned in-laid split gate NVM memory according to one embodiment of the present disclosure. Referring now to FIG. 1, the method of making a self-aligned in-laid split gate NVM memory 10 begins with a semiconductor substrate 12 having a sacrificial layer 14, such as a sacrificial oxide, overlying a top surface thereof. Overlying the sacrificial layer, a template layer 16 of a given thickness is formed. Formation of the template layer can be by deposition to the desired thickness, or can be by deposition and etch back (e.g., using chemical mechanical planarization or other suitable technique) to the desired thickness 17 (shown in FIG. 2). The thickness 17 of the template layer 16 is selected according to the requirements of a given split gate memory implementation. In one embodiment, the thickness 17 of the template layer 16 comprises a thickness on the order of the select gate thickness for the select gate yet to be formed. The template layer is used in the formation of NVM device 10 for purposes as will be explained herein. In one embodiment, the template layer 16 comprises a nitride layer.

Figure 2:
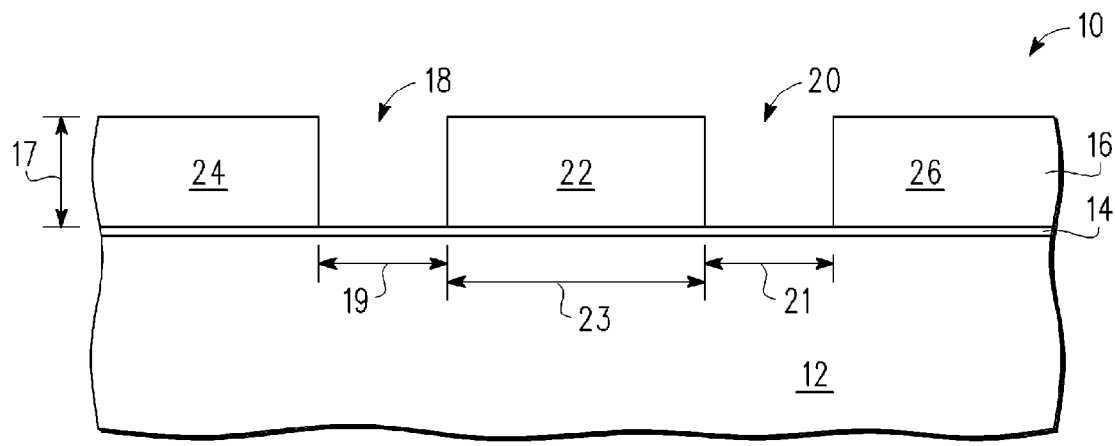

Referring now to FIG. 2, the template layer 16 is patterned using suitable techniques to form first and second openings, indicated by reference numeral 18 and 20, respectively, wherein the first and second openings are spaced apart from one another by a predetermined distance. The widths 19 and 21 of the first and second openings are lithographically defined, wherein the width dimension of the first opening corresponds to a first select gate length and the width dimension of the second opening corresponds to a second select gate length. In one embodiment, first width 19 and the second width 21 are equal widths, wherein the first select gate length equals the second select gate length. In another embodiment, the first width is different from the second width, wherein the first select gate length differs from the second select gate length. Furthermore, the first and second select gate lengths are selected according to the requirements of a given split-gate memory implementation.

The predetermined distance 23 between the first and second openings corresponds to a dimension of portion 22 of the template layer 16 remaining between the openings 18 and 20. In one embodiment, the predetermined distance 23 is at least equal to a contact dimension plus two times (2x) a gate-to-contact spacing. In addition, portion 22 overlies a portion of the substrate 12 corresponding to a shared drain region of split gate devices yet to be formed, as discussed further herein. Region 22 provides for definition of a corresponding edge of an adjacent select gate yet to be formed and protects an underlying semiconductor substrate 12 corresponding to the shared drain region. Regions 24 and 26 form portions of the template layer 16 yet to be removed, also as discussed further herein.

Figure 3:
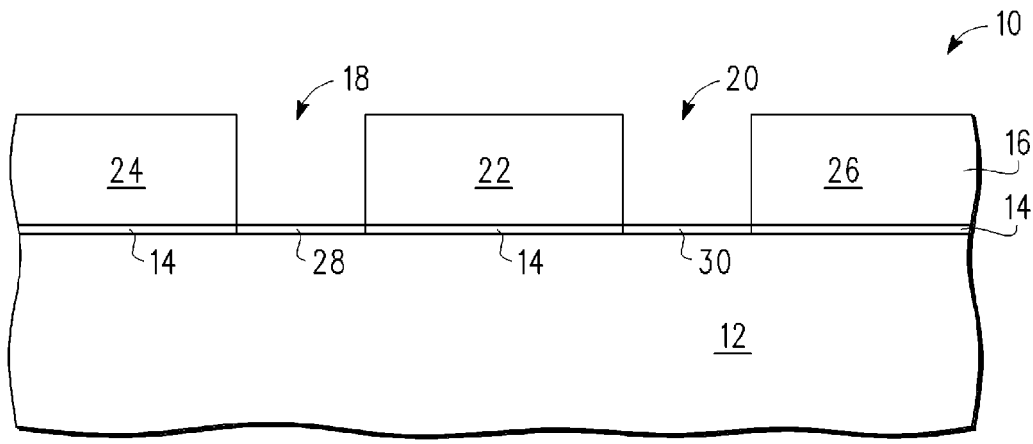

Referring now to FIG. 3, the portions of sacrificial layer 14 exposed by openings 18 and 20 are removed, wherein the removal can be accomplished using any suitable etch, e.g., a wet etch. In one embodiment, a threshold adjust implant may be done within openings 18 and 20 and into the substrate 12 (i.e., in regions of substrate 12 below overlying dielectrics 28 and 30, yet to be formed). Subsequent to removal of the sacrificial layer 14 within the opening 18, a first select gate dielectric 28 is formed within opening 18 overlying substrate 12. Subsequent to removal of the sacrificial layer 14 within the opening 20, a second select gate dielectric 30 is formed within opening 20 overlying substrate 12. In one embodiment, removal of the sacrificial layer 14 within openings 18 and 20 are performed concurrently, and wherein the first select gate dielectric 28 and the second select gate dielectric 30 comprise the same dielectric material. In another embodiment, removal of the sacrificial layer 14 within openings 18 and 20 are performed separately, and wherein the first select gate dielectric 28 and the second select gate dielectric 30 comprise different dielectric materials. Select gate dielectrics 28 and 30 are chosen according to the requirements of a given split gate memory implementation. That is, select gate dielectric 28 or 30 may comprise any suitable gate dielectric for the given split gate memory implementation. Formation of a corresponding dielectric within openings 18 and 20 can be accomplished using any suitable techniques known in the art. In one embodiment, first and second select gate dielectrics 28 and 30 comprise a dielectric having a thickness on the order of 15-100 angstroms.

Figure 4:
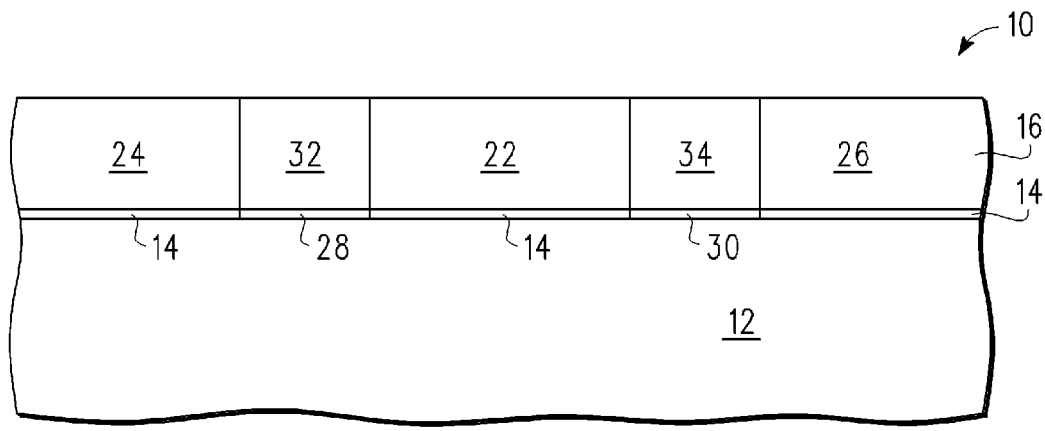

Referring now to FIG. 4, a first select gate material 32 is formed within a remainder portion of opening 18 and a second select gate material 34 is formed with a remainder portion of opening 20. In one embodiment, formation of the first and second select gate materials (32, 34) within openings 18 and 20, respectively, is performed concurrently, and wherein the first select gate material 32 and the second select gate material 34 comprise the same select gate material. In another embodiment, formation of the select gate materials (32,34) within openings 18 and 20, respectively, are performed separately, and wherein the first select gate material 32 and the second select gate material 34 comprise different select gate materials. Select gate materials 32 and 34 are chosen according to the requirements of a given split gate memory implementation. That is, select gate material 32 or 34 may comprise any suitable select gate material for the given split gate memory implementation. Formation of a corresponding select gate material within openings 18 and 20 can be accomplished using any suitable techniques known in the art, such as deposition and polish back (e.g., using chemical mechanical polishing). In one embodiment, first and second select gate materials 32 and 34 comprise polysilicon having a thickness on the order of 800-1500 angstroms.

Figure 5:
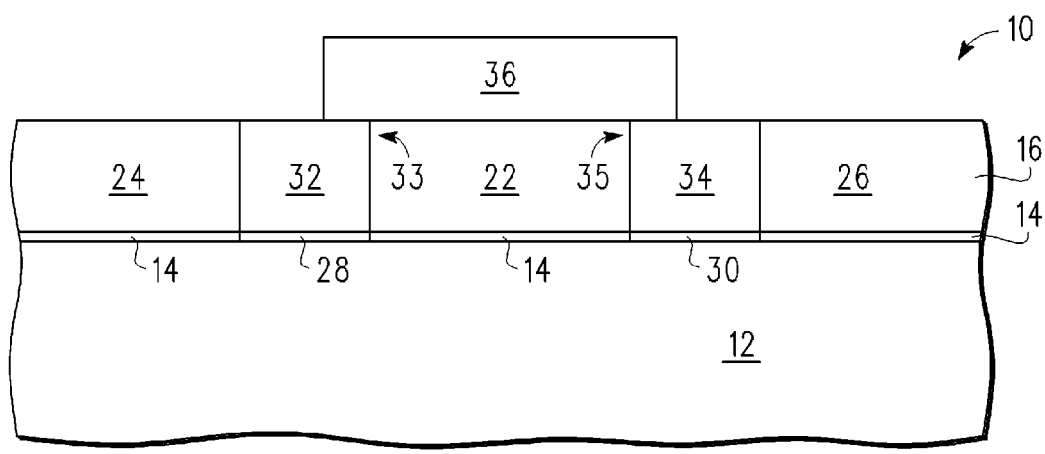

Referring now to FIG. 5, a patterned mask 36 is formed overlying portion 22 of template layer 16 and overlying portions of the first and second select gate material 32 and 34, respectively. In particular, patterned mask 36 overlies (i) a side edge 33 between first select gate material 32 and portion 22 and (ii) a side edge 35 between portion 22 and second select gate material 34. In one embodiment, patterned mask 36 comprises a material which is selective to the material of template layer 16. In addition, patterned mask 36 provides for a given protection, as will be better understood as discussed further herein. In one embodiment, for example, patterned mask 36 comprises photoresist. In addition, portion 22 of template layer 16 provides for (i) select gate edge definition for an edge of each of the first and second select gate materials, (ii) underlying shared drain protection, and (iii) means for excluding formation of a charge storage layer (iii)(a) along desired edges (33,35) of the first and second select gate materials (32,34), as well as (iii)(b) on the surface of the substrate 12 underlying portion 22, during formation of a subsequently formed charge storage layer.

Figure 6:
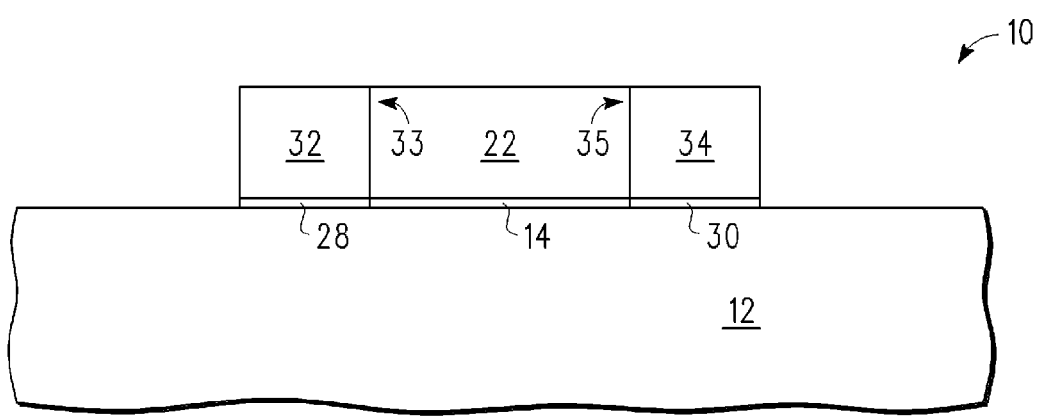

Referring now to FIG. 6, the regions 24 and 26 of the template layer are removed using a suitable etch, i.e., while patterned mask 36 is in place. Subsequent to removal of regions 24 and 26, the portion of sacrificial layer 14 exposed by removal of regions 24 and 26 thereof, is also removed, for example, using a suitable etch. In one embodiment, a threshold voltage adjust implant may be done into the substrate previously occupied by regions 24 and 26 of template layer 16, prior to or subsequent to removal of the portion of sacrificial layer 14. In addition, subsequent to removal of that sacrificial layer, the patterned mask 36 is removed, for example, using a suitable etch, wherein the resultant structure is shown in FIG. 6.

Figure 7:
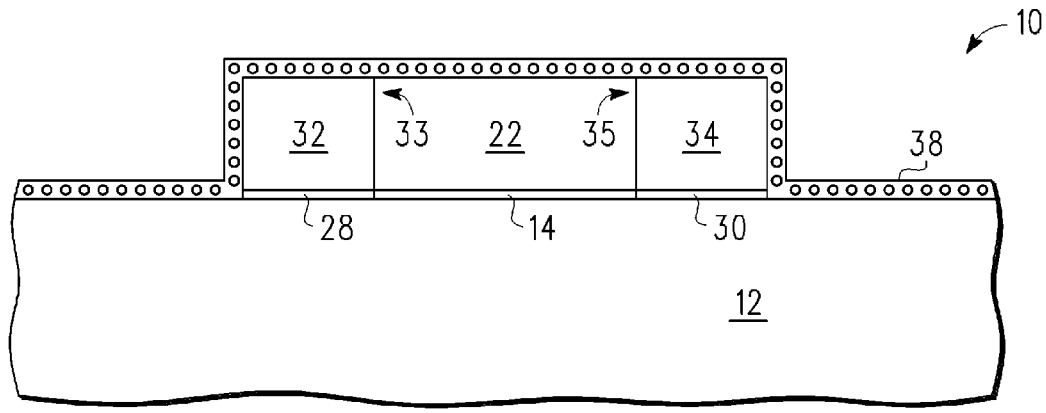

Referring now to FIG. 7, a charge storage layer 38 is formed overlying the structure of FIG. 6. The charge storage layer 38 can comprise any suitable charge storage layer selected according to the requirements of a given split-gate memory implementation. For example, in one embodiment, the charge storage layer 38 comprises a stack of layers, wherein a first layer of the stack includes a bottom dielectric, a second layer of the stack includes one of a nanocrystal layer, nanocluster layer, nanodot layer, or charge-trapping layer, and the third layer includes a top dielectric.

Figure 8:
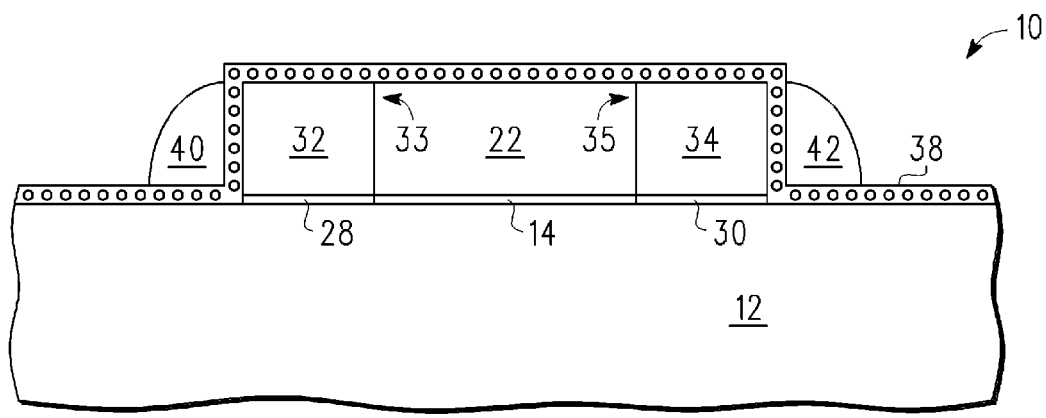

Referring now to FIG. 8, first and second semiconductor sidewall spacers 40 and 42, respectively, are formed. As will be understood further herein, semiconductor sidewall spacers 40 and 42 will become control gates for the split-gate devices yet to be formed. Each control gate and corresponding select gate are thus advantageously self-aligned to one another. In one embodiment, formation of semiconductor sidewall spacers 40 and 42 is performed concurrently, wherein the semiconductor material of sidewall spacer 40 and sidewall spacer 42 comprise the same material. In another embodiment, the semiconductor material of the first sidewall spacer 40 and the semiconductor material of the second sidewall spacer 42 have different properties and/or characteristics. For example, in one embodiment, the semiconductor material of the first sidewall spacer 40 has a different conductivity than a conductivity of sidewall spacer 42. In another embodiment, first and second semiconductor sidewall spacers 40 and 42, respectively, comprise polysilicon sidewall spacers, wherein the polysilicon sidewall spacers are formed using suitable spacer formation techniques known in the art. For example, a desired semiconductor material is formed overlying the resultant structure of FIG. 7 and then subjected to an anisotropic spacer etch to create the corresponding semiconductor sidewall spacers. Furthermore, the width dimension of the first semiconductor sidewall spacer 40 corresponds to a first control gate length and the width dimension of the second semiconductor sidewall spacer 42 corresponds to a second control gate length. The first and second control gate lengths are selected according to the requirements of a given split-gate memory implementation.

Figure 9:
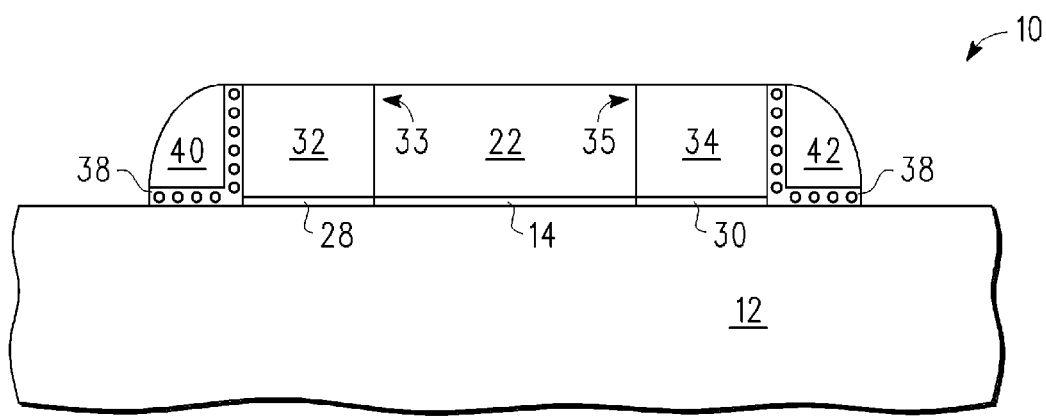

Referring now to FIG. 9, undesired portions (corresponding to exposed portions) of the charge storage layer 38 illustrated in FIG. 8 are removed using any suitable technique. For example, in one embodiment, removal includes the use of a suitable wet etch. In particular, those exposed portions of the charge storage layer 38 in FIG. 8 that overlie (i) substrate 12, (ii) first select gate semiconductor material 32, (iii) portion 22 of template layer 16, and (iv) second select gate semiconductor material 34 are removed, wherein the resultant structure is illustrated in FIG. 9. One advantage of the method according to the embodiments of the present disclosure is that portion 22 provides protection of select gate dielectrics 28 and 30 underlying respective select gates 32 and 34 during removal of the exposed portions of the charge storage layer.

Figure 10:
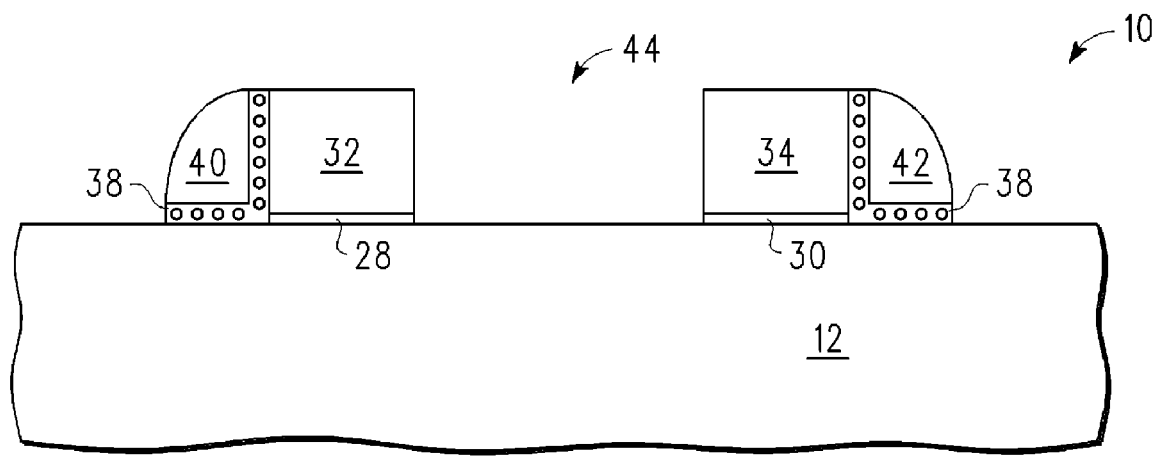

Referring now to FIG. 10, portion 22 and the underlying portion of sacrificial layer 14 are removed to form opening 44, using suitable techniques. In one embodiment, removal of portion 22 can be accomplished using a highly selective wet etch or a suitable dry etch. In addition, removal of sacrificial layer 14 is performed using suitable techniques which have minimal impact upon or damage to the select gate dielectric materials 28 and 30. As a result, an integrity of the select gate dielectric materials 28 and 30 is advantageously maintained.

Figure 11:
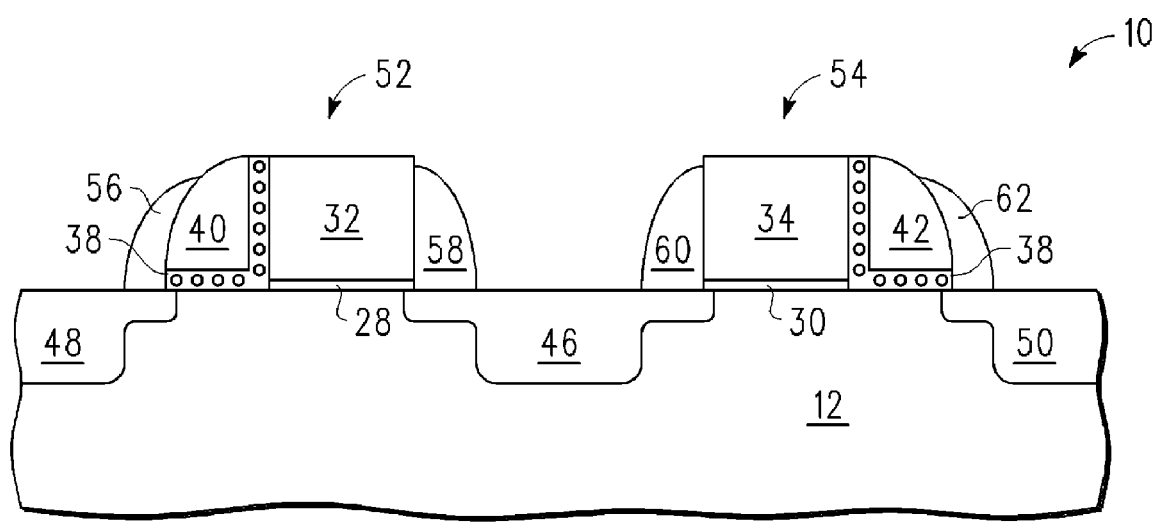
FIG. 11 is a cross-sectional view of a self-aligned in-laid split gate NVM memory according to one embodiment of the present disclosure.

Referring now to FIG. 11, a cross-sectional view of a self-aligned in-laid split gate NVM memory according to one embodiment of the present disclosure is illustrated. The structure of FIG. 10 is further processed using standard techniques to produce the resultant device structure of FIG. 11. In particular, the further processing includes the formation of (i) a shared drain region 46 and (ii) source regions 48 and 50 for split gate devices 52 and 54, respectively. The further processing also includes formation of sidewall spacers 56, 58, 60, and 62, for example, using a suitable anisotropic etch. Viewed from left to right, exposed portions of the (i) source region 48, (ii) control gate 40, (iii) select gate 32, (iv) shared drain region 46, (v) select gate 34, (vi) control gate 42, and (vii) source region 50 are subsequently silicided and contacted using techniques known in the art.

By now it should be appreciated that there has been provided a method of making a semiconductor device over a semiconductor layer, comprises: forming a layer of silicon nitride over the semiconductor layer; patterning the layer of silicon nitride to form a first opening and a second opening in the layer of silicon nitride separated by a first portion of the layer of silicon nitride; depositing gate material in the first opening and the second opening to form a first select gate structure in the first opening and a second select gate structure in the second opening; removing a second portion and a third portion of the layer of silicon nitride while leaving the first portion between the first and second select gate structure, wherein the second portion is adjacent to the first select gate structure and the third portion is adjacent to the second select gate structure; forming a charge storage layer over the semiconductor device after removing the second and third portions; forming a first sidewall spacer of gate material on the charge storage layer and adjacent to the first select gate structure and a second sidewall spacer of gate material on the charge storage layer and adjacent to the second select gate structure; etching the charge storage layer using the first sidewall spacer and the second sidewall spacer as a mask; removing the first portion; and forming a drain region in the semiconductor layer between the first and second select gate structures.

In one embodiment, the step of depositing gate material comprises: depositing a first layer of gate material that fills the first and second openings and extends over the silicon nitride layer; and chemical mechanical polishing the first layer of gate material. In another embodiment, the step of forming a first sidewall spacer of gate material comprises: depositing a second layer of gate material over the semiconductor layer, wherein the second layer of gate material is conformal; and anisotropically etching the second layer of gate material so that portions of the second layer of gate material that are horizontal are removed and the portions of the second layer of gate material that are non-horizontal are retained. In a further embodiment, the step of depositing the second layer of gate material is further characterized by the gate material of the second layer of gate material comprising polysilicon.

In yet another embodiment, the step of depositing the first layer of gate material is further characterized by the gate material of the first layer of gate material comprising polysilicon. The step of forming the drain region is further characterized as simultaneously forming a first source region in the semiconductor layer adjacent to the first sidewall spacer and a second source region in the semiconductor layer adjacent to the second sidewall spacer.

In another embodiment, the method further comprises performing a first threshold voltage adjust implant into the semiconductor layer after the step of patterning the layer of silicon nitride and before the step of depositing gate material in the first opening. The method can further comprise performing a second threshold voltage adjust implant into the semiconductor layer after the step of removing the second and third portions of the layer of silicon nitride and before the step of forming the first sidewall spacer.

In a further embodiment, the step of forming a first sidewall spacer is further characterized by the first and second sidewall spacers being characterized as control gate structures. In a still further embodiment, the step of forming the charge storage layer is further characterized by the charge storage layer comprising nanocrystals.

According to one embodiment, a method of forming a pair of non-volatile memory cells using a semiconductor layer having a first conductivity type, comprises: forming a silicon nitride layer over the semiconductor layer; patterning the silicon nitride layer to define a first portion of nitride, a second portion of nitride, and a third portion of nitride, wherein the first portion and the second portion are separated by a first opening and the third portion and the second portion are separated by a second opening; depositing a first layer of semiconductor material to a thickness at least sufficient to fill the first and second openings; chemical mechanical polishing the first layer to remove the first layer from over the first, second, and third portions to leave a first gate structure in the first opening and a second gate structure in the second opening; removing the first portion in a region adjacent to the first gate structure and the third portion in a region adjacent to the second gate structure; forming a charge storage layer over the semiconductor layer after the step of removing the first portion; depositing a second layer of semiconductor material over the charge storage layer; anisotropically etching the second layer of semiconductor material to leave a first sidewall spacer and a second sidewall spacer from the second layer of semiconductor material and removing the second layer of semiconductor material from over the first and second gate structures and the first portion; removing the charge storage layer from over the first and second gate structures and the first portion; removing the first portion; and doping the semiconductor layer adjacent to the first and second sidewalls and between the first and second gate structures to a second conductivity type. In one embodiment, the step of depositing the first layer of semiconductor material is further characterized as the semiconductor material comprising polysilicon. In another embodiment, the step of forming the charge storage layer comprises: forming a first dielectric layer; forming nanocrystals on the first dielectric layer; and forming a second dielectric layer over the nanocrystals.

In another embodiment, the method further comprises: implanting into the semiconductor layer after the step of patterning the silicon nitride layer and before the step of depositing the first layer. The method still further comprises: growing an oxide layer on the semiconductor layer prior to forming the silicon nitride layer, wherein: the step of implanting is further characterized by the implanting occurring through the oxide layer. In a still further embodiment, the method further comprises: removing the oxide layer in the first and second openings after the step of patterning the silicon nitride layer; and growing a gate dielectric of oxide on the semiconductor layer in the first and second openings after the step of removing the oxide layer and before the step of depositing the first layer. In a yet still further embodiment, the method further comprises implanting into the semiconductor layer adjacent to the first gate structure and adjacent to the second gate structure after the step of removing the first portion and third portion and prior to the step of forming the charge storage layer.

In another embodiment, a method of forming a semiconductor device, comprises: providing a semiconductor layer; forming an oxide layer over the semiconductor layer; forming a silicon nitride layer over the oxide layer; etching the silicon nitride layer through to the oxide layer according to a pattern which results in a first opening and a second opening;

implanting into the semiconductor layer through the first and second openings; removing the oxide layer in the first and second openings; forming a first gate dielectric over the semiconductor layer in the first opening and a second gate dielectric over the semiconductor layer in the second opening; forming a first select gate structure on the first gate dielectric in the first opening and a second select gate structure on the second gate dielectric in the second opening; removing portions of the silicon nitride layer adjacent to the first and second select gate structures while leaving a portion of the silicon nitride layer between the first and second select gate structures; forming a charge storage layer over the semiconductor layer; forming a first sidewall spacer of semiconductor material over the charge storage layer and adjacent to the first select gate structure and a second sidewall spacer of semiconductor material over the charge storage layer and adjacent to the second select gate structure; removing the portion of the silicon nitride layer between the first and second select gate structures; and forming doped regions in the semiconductor layer between the first and select gate structures and adjacent to the first and second sidewall spacers. In another embodiment, the method further comprises implanting into the semiconductor layer adjacent to the first and second select gate structures before the step of forming the charge storage layer. In addition, the step of providing the semiconductor layer is further characterized by the semiconductor layer being a top portion of a substrate, wherein the substrate comprises one of a group consisting of a bulk substrate and a semiconductor on insulator substrate.

Because the apparatus implementing the present invention is, for the most part, composed of components and processes known to those skilled in the art, specific semiconductor details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the embodiments of the present disclosure are applicable to embedded and/or stand-alone memory applications. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device over a semiconductor layer, comprising:
   forming a layer of silicon nitride over the semiconductor layer;
   patterning the layer of silicon nitride to form a first opening and a second opening in the layer of silicon nitride separated by a first portion of the layer of silicon nitride;
   depositing gate material in the first opening and the second opening to form a first select gate structure in the first opening and a second select gate structure in the second opening;
   removing a second portion and a third portion of the layer of silicon nitride while leaving the first portion between the first and second select gate structure, wherein the second portion is adjacent to the first select gate structure and the third portion is adjacent to the second select gate structure;
   forming a charge storage layer over the semiconductor device after removing the second and third portions;
   forming a first sidewall spacer of gate material on the charge storage layer and adjacent to the first select gate structure and a second sidewall spacer of gate material on the charge storage layer and adjacent to the second select gate structure;
   etching the charge storage layer using the first sidewall spacer and the second sidewall spacer as a mask; and
   removing the first portion; and
   forming a drain region in the semiconductor layer between the first and second select gate structures.

2. The method of claim 1, wherein the step of depositing gate material comprises:
   depositing a first layer of gate material that fills the first and second openings and extends over the silicon nitride layer; and
   chemical mechanical polishing the first layer of gate material.

3. The method of claim 2, wherein the step of forming a first sidewall spacer of gate material comprises:
   depositing a second layer of gate material over the semiconductor layer, wherein the second layer of gate material is conformal; and
   anisotropically etching the second layer of gate material so that portions of the second layer of gate material that are horizontal are removed and the portions of the second layer of gate material that are non-horizontal are retained.

4. The method of claim 3, wherein the step of depositing the second layer of gate material is further characterized by the gate material of the second layer of gate material comprising polysilicon.

5. The method of claim 2, wherein the step of depositing the first layer of gate material is further characterized by the gate material of the first layer of gate material comprising polysilicon.

6. The method of claim 1, wherein the step of forming the drain region is further characterized as simultaneously forming a first source region in the semiconductor layer adjacent to the first sidewall spacer and a second source region in the semiconductor layer adjacent to the second sidewall spacer.

7. The method of claim 1, further comprising performing a first threshold voltage adjust implant into the semiconductor layer after the step of patterning the layer of silicon nitride and before the step of depositing gate material in the first opening.

8. The method of claim 7, further comprising performing a second threshold voltage adjust implant into the semiconductor layer after the step of removing the second and third portions of the layer of silicon nitride and before the step of forming the first sidewall spacer.

9. The method of claim 1, wherein the step of forming a first sidewall spacer is further characterized by the first and second sidewall spacers being characterized as control gate structures.

10. The method of claim 1, wherein the step of forming the charge storage layer is further characterized by the charge storage layer comprising nanocrystals.

* * * * *